United States Patent
Lee et al.

(10) Patent No.: US 12,031,232 B2
(45) Date of Patent: *Jul. 9, 2024

(54) PIEZOELECTRIC SINGLE CRYSTAL, FABRICATION METHOD THEREFOR, AND PIEZOELECTRIC AND DIELECTRIC APPLICATION PARTS USING SAME

(71) Applicant: CERACOMP CO., LTD., Anyang-si (KR)

(72) Inventors: Ho Yong Lee, Seoul (KR); Won Sun Baick, Seoul (KR); Dong Ho Kim, Seoul (KR); Moon Chan Kim, Seoul (KR)

(73) Assignee: CERACOMP CO., LTD., Asan-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/928,604

(22) PCT Filed: Dec. 8, 2021

(86) PCT No.: PCT/KR2021/018537
§ 371 (c)(1),
(2) Date: Nov. 29, 2022

(87) PCT Pub. No.: WO2022/124792
PCT Pub. Date: Jun. 16, 2022

(65) Prior Publication Data
US 2023/0399769 A1    Dec. 14, 2023

(30) Foreign Application Priority Data

Dec. 11, 2020   (KR) .......... 10-2020-0173604
Dec. 3, 2021    (KR) .......... 10-2021-0171666

(51) Int. Cl.
| | | |
|---|---|---|
| *C30B 29/32* | (2006.01) | |
| *C01G 33/00* | (2006.01) | |
| *C08K 3/22* | (2006.01) | |
| *C30B 1/12* | (2006.01) | |
| *C30B 29/30* | (2006.01) | |
| *H10N 30/097* | (2023.01) | |
| *H10N 30/85* | (2023.01) | |
| *H10N 30/853* | (2023.01) | |

(52) U.S. Cl.
CPC .......... *C30B 29/32* (2013.01); *C01G 33/006* (2013.01); *C08K 3/22* (2013.01); *C30B 1/12* (2013.01); *C30B 29/30* (2013.01); *H10N 30/097* (2023.02); *H10N 30/8536* (2023.02); *C01P 2002/34* (2013.01); *C01P 2002/52* (2013.01); *C01P 2006/40* (2013.01); *C08K 2003/2244* (2013.01); *C08K 2201/001* (2013.01)

(58) Field of Classification Search
CPC ......... C30B 29/22; C30B 29/24; C30B 29/30; C30B 29/32; H10N 30/85; H10N 30/852; H10N 30/853; H10N 30/8536; H10N 30/8548; H10N 30/8554; H10N 30/8561; H10N 70/8836
See application file for complete search history.

(56) References Cited

U.S. PATENT DOCUMENTS

| | | | |
|---|---|---|---|
| 2008/0290315 A1* | 11/2008 | Lee ............... | H10N 30/85 252/62.9 PZ |
| 2009/0212667 A1 | 8/2009 | Matsushita | |
| 2013/0127298 A1 | 5/2013 | Kubota et al. | |
| 2015/0372219 A1 | 12/2015 | Yamashita et al. | |

FOREIGN PATENT DOCUMENTS

| | | |
|---|---|---|
| KR | 100564092 | 3/2006 |
| KR | 100743614 | 7/2007 |
| KR | 20120131193 | 12/2012 |
| KR | 101779899 | 9/2017 |

OTHER PUBLICATIONS

Machine translation of KR101779899 B1, 14 pages. (Year: 2017).*
International Search Report—PCT/KR2021/018537 dated Mar. 25, 2022.
Park et al., Characteristics of Relaxor-Based Piezoelectric Single Crystals for Ultrasonic Transducers, IEEE Transactions on Ultrasonics, Ferroelectrics, and Frequency Control, vol. 44, No. 5, Sep. 1997, pp. 1140-1147.

* cited by examiner

*Primary Examiner* — Matthew E. Hoban
*Assistant Examiner* — Lynne Edmondson
(74) *Attorney, Agent, or Firm* — CANTOR COLBURN LLP

(57) ABSTRACT

Provided is a piezoelectric single crystal, a method of manufacturing the piezoelectric single crystal, and piezoelectric and dielectric application components using the piezoelectric single crystal. The piezoelectric single crystal shows that characteristics of the piezoelectric single crystal are maximized through the control of composition concerning ions located at [A] from a perovskite type crystal structure ([A][B]O$_3$), the single crystal of uniform composition can be provided without a composition gradient even in case of complex, chemical composition thanks to a solid phase single crystal growth method, and in particular, the piezoelectric single crystal is provided in a form which causes large resistance to a mechanical impact, and facilitates mechanical processing, so the piezoelectric single crystal can usefully be applied to the piezoelectric application component and the dielectric application component, like ultrasonic transducers, piezoelectric actuators, piezoelectric sensor, dielectric capacitors, using the piezoelectric single crystal pertain.

21 Claims, No Drawings

PIEZOELECTRIC SINGLE CRYSTAL, FABRICATION METHOD THEREFOR, AND PIEZOELECTRIC AND DIELECTRIC APPLICATION PARTS USING SAME

TECHNICAL FIELD

The present invention relates to a piezoelectric singe crystal, a method of manufacturing the same, and piezoelectric and dielectric application components using the piezoelectric single crystal, and more particularly, to a piezoelectric singe crystal having a perovskite type crystal structure, which is configured in such a manner that characteristics of the piezoelectric single crystal is improved through the control of composition of ions located at [A] from the perovskite type crystal structure ([A][B]$O_3$) so that a high dielectric constant ($K_3^T \geq 4,000$ to $15,000$), a high piezoelectric charge constant ($d_{33} \geq 1,400$ to $6,000$ pC/N), and a high coercive electric field ($E_C \geq 4$ to $12$ kV/cm) can be realized simultaneously, and the piezoelectric single crystal is manufactured by a solid phase single crystal growth method so that the uniform piezoelectric single crystal can be provided without a composition gradient even when composition is complex, chemical composition, and mechanical characteristics are realized simultaneously, a method of manufacturing the piezoelectric single crystal, and piezoelectric and dielectric application components using the piezoelectric single crystal.

BACKGROUND ART

Since piezoelectric single crystals having a perovskite type crystal structure ([A][B]$O_3$) show a dielectric constant $K_3^T$, a piezoelectric charge constants $d_{33}$, and a longitudinal electromechanical coupling coefficient $k_{33}$ which are incredibly high beyond those shown in existing piezoelectric polycrystal materials, it is expected that the piezoelectric single crystals will be applied to high-performance components, like piezoelectric actuators, ultrasonic transducers, piezoelectric sensors, dielectric capacitors, and so on, and their practical application will also lead them to various kinds of substrate materials for thin film elements.

Examples of piezoelectric single crystals having a perovskite type crystal structure which have been developed until today include PMN-PT (Pb(Mg$_{1/3}$Nb$_{2/3}$)$O_3$—PbTiO$_3$), PZN-PT (Pb(Zn$_{1/3}$Nb$_{2/3}$)$O_3$—PbTiO$_3$), PInN-PT (Pb(In$_{1/2}$Nb$_{1/2}$)$O_3$—PbTiO$_3$), PYbN-PT (Pb(Yb$_{1/2}$Nb$_{1/2}$)$O_3$—PbTiO$_3$), PSN-PT (Pb(Sc$_{1/2}$Nb$_{1/2}$)$O_3$—PbTiO$_3$), PMN-PInN-PT, PMN-PYbN-PT, BiScO$_3$—PbTiO$_3$ (BS-PT), and so on. Since these single crystals show a congruent melting behavior at the time of melting, they have usually been manufactured by a flux method, a Bridgman method, and so on that are existing single crystal growth methods.

However, although the piezoelectric single crystals of PMN-PT and PZN-PT developed before have the advantage of showing high dielectric and piezoelectric characteristics (i.e., $K_3^T > 4,000$, $d_{33} > 1,400$ pC/N, and $k_{33} > 0.85$) at the normal temperature, they are largely restricted in a workable temperature range, or a condition of operational voltage of the piezoelectric single crystal, and a condition of production on components to which the piezoelectric single crystals are applied, and so on due to defects, like low phase transition temperatures $T_C$ and $T_{RT}$, a low coercive electric field $E_C$, brittleness, and so on.

In general, piezoelectric single crystals having a perovskite type crystal structure have been known as showing the highest dielectric and piezoelectric characteristics from a neighboring boundary with respect to composition in a morphotropic phase boundary (MPB) between a rhombohedral phase and a tetragonal phase.

However, since the piezoelectric single crystals having the perovskite type crystal structure generally show the best excellent dielectric and piezoelectric characteristics when they are in a rhombohedral phase, practical application of the piezoelectric single crystals in the rhombohedral phase has been carried out most actively, but since the piezoelectric single crystals in the rhombohedral phase are stable only at a phase transition temperature $T_{RT}$ or below between the rhombohedral phase and a tetragonal phase, they can be used only at the phase transition temperature $T_{RT}$ or below, the greatest temperature at which the rhombohedral phase is stable. Accordingly, in case that the phase transition temperature $T_{RT}$ is low, a workable temperature for the piezoelectric single crystals in the rhombohedral phase gets low, and a temperature required for manufacturing components to which the piezoelectric single crystals are applied, and a workable temperature for the application components are also limited to the phase transition temperature $T_{RT}$ or below.

Also, in case that phase transition temperatures $T_C$ and $T_{RT}$, and a coercive electric field $E_C$ are low, depoling easily occurs from the piezoelectric single crystals under the conditions of mechanical processing, stress, heat generation, and driving voltage, and the loss of excellent dielectric and piezoelectric characteristics occurs. Accordingly, the piezoelectric single crystals, which show that phase transition temperatures $T_C$ and $T_{RT}$, and a coercive electric field $E_C$ are low, are restricted in a manufacturing condition of components to which the single crystals are applied, a condition of workable temperatures, a condition of driving voltage, and so on. In case of the PMN-PT single crystal, a curie temperature $T_C$, a phase transition temperature $T_{RT}$, and a coercive electric field $E_C$ generally satisfy $T_C < 150°$ C., $T_{RT} < 80°$ C., and $E_C < 2.5$ kV/cm, respectively, and in case of the PZN-PT single crystal, a curie temperature $T_C$, a phase transition temperature $T_{RT}$, and a coercive electric field $E_C$ generally satisfy $T_C < 170°$ C., $T_{RT} < 100°$ C., and $E_C < 3.5$ kV/cm, respectively. Furthermore, since dielectric and piezoelectric components manufactured using these piezoelectric single crystals are also restricted in a manufacturing condition, the condition of a workable temperature range or operational voltage, and so on, this has been an obstacle to the development and the practical use of components to which the piezoelectric single crystals are applied.

In order to overcome the weak points of the piezoelectric single crystals, single crystals of novel composition, like PInN-PT, PSN-PT, BS-PT, and so on, have been developed, and various kinds of single crystal composition in a mixed form, like PMN-PInN-PT, PMN-BS-PT, and so on, have also been studied.

However, in case of these single crystals, it is problematic in that a dielectric constant, a piezoelectric charge constant, phase transition temperatures, a coercive electric field, and mechanical characteristics, and so on couldn't be improved simultaneously, and in case of piezoelectric single crystals of composition including costly elements, like Sc, In, and so on, as main ingredients, it is problematic in that the high cost of production for the single crystals has been an obstacle to practical use of the single crystals.

The reason why piezoelectric single crystals having a perovskite type crystal structure comprising PMN-PT developed until today show a low phase transition temperature may largely be divided into three points: first, the phase transition temperature of a relaxor (PMN, PZN, or the like) which is a main constituent in addition to PT is low.

Non-Patent Document 1 presents a phase transition temperature TC between a tetragonal phase and a cubical phase of piezoelectric ceramic polycrystals having a perovskite type structure in Table 1. Since a curie temperature of the piezoelectric single crystals is similar to that of the polycrystals of the same composition, the curie temperature of the piezoelectric single crystals can be estimated on the basis of that of the polycrystals.

Second, since a morphotropic phase boundary (MPB) at which a tetragonal phase and a rhombohedral phase form the boundary is inclined smoothly rather than being perpendicular to a temperature axis, it is necessarily required to decrease a curie temperature $T_C$ in order to raise a phase transition temperature $T_{RT}$ between the rhombohedral phase and the tetragonal phase, so it is difficult to simultaneously raise the curie temperature TC, and the phase transition temperature $T_{RT}$ between the rhombohedral phase and the tetragonal phase.

Third, even when a relaxor (PYbN, PInN, $BiScO_3$, or the like) having a relatively high phase transition temperature is mixed into PMN-PT, and so on, no phase transition temperature increases simply in proportion to composition, or the problem of a decline in dielectric and piezoelectric characteristics occurs.

Furthermore, with respect to single crystals in relaxor-PT series presented in Non-Patent Document 1 manufactured by a flux method, a Bridgman method, and so on which are existing single crystal growth methods, due to a reason related with a manufacturing process of the single crystals, it is difficult to manufacture large single crystals whose composition is uniform, and due to the high cost of production, and difficulty in mass production, the single crystals have not yet succeeded in their commercialization.

Also, in general, since piezoelectric ceramic single crystals have low mechanical strength and low fracture toughness compared with those shown in piezoelectric ceramic polycrystals (polycrystalline ceramic), it is defective in that they are easy to break even due to a small mechanical impact. Brittleness of these piezoelectric single crystals easily gives rise to fracture of the piezoelectric single crystals during manufacturing and using of applied components using the piezoelectric single crystals, so it has been a large limit to use of the piezoelectric single crystals. Accordingly, it is necessary for the commercialization of piezoelectric single crystals to improve mechanical characteristics simultaneously with improving dielectric and piezoelectric characteristics of the piezoelectric single crystals.

Thus, as a result of the present inventors' steady efforts for improving the conventional problems and for providing piezoelectric single crystals in a level which are applicable to a high-performance, high-precision, and high value-added market, the present invention has been completed in such a manner as to design composition of ions located at [A] from a perovskite type crystal structure ($[A][B]O_3$) in order to improve a piezoelectric characteristic of a single crystal based on a result which shows that the piezoelectric characteristic is improved as chemical composition which constitutes the piezoelectric single crystal is complicated, and to confirm production of a piezoelectric single crystal having mechanical characteristics simultaneously with having uniformity without a composition gradient even in case of complex, chemical composition, and an improved piezoelectric characteristic using a solid phase growth method.

Patent Document 1: Korean Patent No. 0564092 (officially announced on Mar. 27, 2006)
Patent Document 2: Korean Patent No. 0743614 (officially announced on Jul. 30, 2007)

(Non-Patent Document 1): IEEE Transactions on Ultrasonics, Ferroelectrics, and Frequency Control, vol. 44, no. 5, 1997, pp. 1140-1147.

DETAILED DESCRIPTION OF THE INVENTION

Technical Problem

An object of the present invention is to provide a novel piezoelectric single crystal having a perovskite type crystal structure of ($[A][B]O_3$) represented by a compositional formula.

Another object of the present invention is to provide a method of manufacturing the piezoelectric single crystal.

The other object of the present invention is to provide a piezoelectric application component or a dielectric application component using the piezoelectric single crystal.

Solution for Solving the Problem

In order to accomplish the objects as described above, the present invention provides a piezoelectric single crystal represented by a compositional formula of Chemical Formula 1 below:

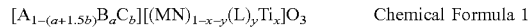     Chemical Formula 1 in said formula, A represents Pb or Ba,
B represents at least one or more elements selected from a group consisting of Ba, Ca, Co, Fe, Ni, Sn, and Sr,
C represents one or more elements selected from a group consisting of Co, Fe, La, Ce, Pr, Nd, Pm, Sm, Eu, Gd, Tb, Dy, Ho, Er, Tm, Yb, and Lu,
L represents a single form composed of one selected from Zr or Hf, or a mixed form thereof,
M represents at least one or more element selected from a group consisting of Ce, Co, Fe, In, Mg, Mn, Ni, Sc, Yb, and Zn,
N represents at least one or more elements selected from a group consisting of Nb, Sb, Ta, and W,
a represents 0<a≤0.10,
b represents 0<b≤0.05,
x represents ≤x≤0.58, and
y represents 0.05≤y≤0.62.

At this time, when L represents a mixed form, the piezoelectric single crystal expressed by a compositional formula of Chemical Formula 2 below is provided:

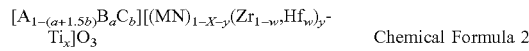     Chemical Formula 2 in said formula, A, B, C, M, and N are identical with those defined in said Chemical Formula 1, and a, b, x, and y are also identical with those defined in said Chemical Formula 1. However, w represents 0.01≤w≤0.20

With respect to the piezoelectric single crystal represented by the compositional formula of Chemical Formula 1 according to the present invention, composition satisfies a requisite of 0.01≤a≤0.10 and a requisite of 0.01≤b≤0.05, more preferably, satisfying a requisite of a/b≥2 in said formula.

With respect to the piezoelectric single crystal represented by the compositional formula of Chemical Formula 1 according to the present invention, it is more preferable to satisfy 0.10≤x≤0.58 and 0.10≤y≤0.62.

Also, the piezoelectric single crystal represented by the compositional formula of Chemical Formula 1 according to the present invention shows that a composition gradient inside of the single crystal is formed in a range of 0.2 to 0.5 mol %, and has a feature of uniformity.

A 0.1 to 20% reinforced second phase P may further be included in the composition of the piezoelectric single crystal at a volume ratio, and the reinforced second phase P is a metal phase, an oxide phase, or a pore.

More specifically, the reinforced second phase P is at least one or more materials selected from a group consisting of Au, Ag, Ir, Pt, Pd, Rh, MgO, $ZrO_2$, and a pore, and the reinforced second phase P is uniformly distributed in a grain form inside of the piezoelectric single crystal, or is regularly distributed while having a fixed pattern.

Also, with respect to the piezoelectric single crystal, said x and said y belong into a range of within 10 mol % from composition in a morphotropic phase boundary (MPB) between a rhombohedral phase and a tetragonal phase, more preferably, said x and said y belong into a range of within 5 mol % from the composition in the morphotropic phase boundary (MPB) between the rhombohedral phase and the tetragonal phase.

With respect to The piezoelectric single crystal described above, a curie temperature $T_C$ is 180° C.; or more, and at the same time as this, a phase transition temperature $T_{RT}$ between the rhombohedral phase and the tetragonal phase is 100° C. or more.

Also, the piezoelectric single crystal satisfies that a longitudinal electromechanical coupling coefficient $k_{33}$ is 0.85 or more, and a coercive electric field $E_C$ is 3.5 to 12 kV/cm.

In particular, the piezoelectric single crystal satisfies that a dielectric constant $K_3^T$ is 4,000 to 15,000, and a piezoelectric charge constant $d_{33}$ is 1,400 to 6,000 pC/N.

The present invention provides a method of a piezoelectric single crystal, comprising: Step (a) of reducing number density of abnormal grains (i.e., the number of abnormal grains/unit area) by adjusting an average size of matrix grains of a polycrystal based on the composition as described above; and Step (b) of growing the abnormal grains by heat-treating the polycrystal which shows that the number density of the abnormal grains obtained through said Step (a) decreases, wherein a power molding substance is obtained in such a manner as to calcine powder based on the composition constituting the piezoelectric single crystal at a temperature of less than 800 to 900° C., and a first heat treatment process of sintering the powder molding substance, and a second heat treatment process required at the time of growth of the single crystal are carried out.

According to another manufacturing method, the present invention provides the manufacturing method of the piezoelectric single crystal comprising thermal treating a polycrystal under a condition that an average size of matrix grains of the polycrystal based on the composition as descried above is adjusted so that number density of abnormal grains decreases.

Based on the above fact, the single crystal may be obtained in such a manner as to continuously grow only a small number of abnormal grains generated in a state of the number density of the abnormal grains of the polycrystal being reduced.

The present invention may provide the manufacturing method of the piezoelectric single crystal comprising continuously growing a seed single crystal inside of the polycrystal during heat treatment by uniting the seed single crystal with the polycrystal before the heat treatment of the polycrystal. At this time, an average size R of the matrix grains of the polycrystal is adjusted into the range of a size which is 0.5 times larger and 2 times smaller than a critical size (an average size $R_c$ of the matrix grains which shows that number density of the abnormal grains becomes "0 (zero)") bringing about generation of the abnormal grains.

Furthermore, the present invention provides a piezoelectric application component and a dielectric application component using a piezoelectric body composed of the piezoelectric single crystal, or a piezoelectric body in which the piezoelectric single crystal, and a polymer are mixed.

The piezoelectric application component and the dielectric application component may be applied to any one selected from a group consisting of ultrasonic transducers, piezoelectric actuators, piezoelectric sensors, dielectric capacitors, electric field-generating transducers, and electric field and vibration-generating transducers.

Effect of the Invention

The piezoelectric single crystal according to the present invention can cause dielectric characteristics of a high dielectric constant $K_3^T$, high piezoelectric charge constants $d_{33}$ and $k_{33}$, high phase transition temperatures $T_C$ and $T_{RT}$, and a high coercive electric field $E_C$ to be improved remarkably through the complex composition of ions located at [A] from the perovskite type crystal structure ([A][B]$O_3$).

Also, the piezoelectric single crystal of the present invention can have uniformity without a composition gradient even in case of complex, chemical composition through a solid phase single crystal growth method, and can improve piezoelectric characteristics, and at the same time as this, the manufacturing method can be provided in a form that enables high resistance to a mechanical impact by a pore occurring from a process of the solid phase single crystal growth, and facilitates mechanical processing.

Furthermore, the present invention has the advantage of being useful in a wide temperature area, and a condition of operational voltage because mechanical characteristics are realized simultaneously, and the present invention can be applied to the field for which high-performance, high-precision, and high added value are required.

Accordingly, it is possible to commercialize piezoelectric single crystals by manufacturing the piezoelectric single crystals using the appropriate solid single crystal growth method to mass production of the single crystals, and developing composition of the single crystals not comprising costly raw materials, and the applied components according to the present invention use piezoelectric single crystals having excellent characteristics so that the piezoelectric and dielectric application components can be manufactured and used in a wide temperature area.

BEST MODE FOR CARRYING OUT THE INVENTION

Hereinafter, the present invention is described in detail.

The present invention provides a piezoelectric single crystal represented by a compositional formula of Chemical Formula 1 below:

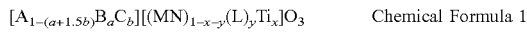
$[A_{1-(a+1.5b)}B_aC_b][(MN)_{1-x-y}(L)_yTi_x]O_3$       Chemical Formula 1 in said formula, A represents Pb or Ba,

B represents at least one or more elements selected from a group consisting of Ba, Ca, Co, Fe, Ni, Sn, and Sr, C represents one or more elements selected from a group consisting of Co, Fe, La, Ce, Pr, Nd, Pm, Sm, Eu, Gd, Tb, Dy, Ho, Er, Tm, Yb, and Lu, L represents a single form composed of one selected from Zr or Hf, or a mixed form thereof, M represents at least one or more element selected from a group consisting of Ce, Co, Fe, In, Mg, Mn, Ni, Sc, Yb, and Zn, N represents at least one or more elements selected from a group consisting of Nb, Sb, Ta, and W, a represents $0<a\leq 0.10$,
b represents $0<b\leq 0.05$,
x represents $\leq x\leq 0.58$, and
y represents $0.05\leq y\leq 0.62$.

Based on the fact that the piezoelectric single crystal represented by the compositional formula of said Chemical Formula 1 shows a tendency that the more chemical composition is complicated, the more a piezoelectric characteristic increases, composition of ions located at [A] from the perovskite type crystal structure ([A][B]$O_3$) is formed in complex composition.

At this time, specifically reviewing the complex composition of the ions located at [A] from the piezoelectric single crystal represented by the compositional formula of said Chemical Formula 1, the complex composition may be configured into [$A_{1-(a+1.5b)}B_aC_b$], composition of said A comprises a flexible or inflexible element, and the examples of the present invention are described based on only piezoelectric single crystals in flexible series in which A represents Pb, but A shouldn't be construed as being limited thereto.

With respect to the ions located at [A], composition of B includes a metal dyad, preferably, at least one or more elements selected from a group consisting of Ba, Ca, Co, Fe, Ni, Sn, and Sr, and a metal triad is used in composition of C.

It is preferable to use one or more elements selected from a group consisting of Co, Fe, La, Ce, Pr, Nd, Pm, Sm, Eu, Gd, Tb, Dy, Ho, Er, Tm, Yb, and Lu, and it is more preferable to use an element in lanthanide series in a single form, or elements in lanthanide series in a form in which two elements are mixed.

In the examples of the present invention, with respect to the ions located at [A], it is described that the composition of C represents composition including La, Sm, or Bi alone, or composition in which one or more elements selected from them are mixed, but it should not be limited thereto.

With respect to the complex composition of the ions located at [A] from the piezoelectric single crystal represented by the compositional formula of said Chemical Formula 1, the composition of [$A_{1-(a+1.5b)}B_aC_b$] corresponding to the ions located at [A] is a requisite required for realizing targeted physical properties, and is characteristic in that when A is a piezoelectric single crystal in flexible or inflexible series, it is composed by mixing of a metal dyad and a metal triad.

That is, $0.01\leq a\leq 0.10$, and $0.01\leq b\leq 0.05$ should be satisfied, and more preferably, $a/b\geq 2$ should be satisfied. At this time, in the composition, when a is less than 0.01, it is problematic in that a perovskite type phase is unstable, and when a exceeds 0.10, it is not preferable in that it is difficult to put it into practical use because a phase transition temperature gets too low.

Also, if the requisite deviates from $a/b\geq 2$, it will be problematic in that no dielectric and piezoelectric characteristics are maximized, or growth of the single crystal is limited.

At this time, with respect to the complex composition of the ions located at [A] from the piezoelectric single crystal represented by the compositional formula of Chemical Formula 1, in case of the complex composition, an excellent dielectric constant beyond that shown in case of composition composed of a metal triad alone, or a metal dyad alone may be realized.

According to a state diagram of [A][MN]$O_3$—PbTi$O_3$—PbZr$O_3$ known generally, it represents a composition area showing excellent dielectric and piezoelectric characteristics from the surroundings of a morphotrophic phase boundary between a rhombohedral phase and a tetragonal phase. In the state diagram of [A][MN]$O_3$—PbTi$O_3$—PbZr$O_3$, the dielectric and piezoelectric characteristics are maximized from composition in the morphotrophic phase boundary between the rhombohedral phase and the tetragonal phase, and the dielectric and piezoelectric characteristics decrease gradually as composition gradually goes away from the composition in the MPB. Furthermore, in case of within 5 mol % of composition into an area of the rhombohedral phase from the composition in the MPB, since a decrease in the dielectric and piezoelectric characteristics is small, very high values of the dielectric and piezoelectric characteristics are maintained, and in case of within 10 mol % of composition into the area of the rhombohedral phase from the composition in the MPB, the dielectric and piezoelectric characteristics decrease consecutively, but sufficient high dielectric and piezoelectric characteristic values to be applied to dielectric and piezoelectric application components are shown. In case that composition changes to composition into an area of the tetragonal phase from the composition in the MPB, a decrease in the dielectric and piezoelectric characteristics occurs more rapidly than in the area of the rhombohedral phase. However, even in case of within 5 mol % of the composition into the area of the tetragonal phase, or in case of within 10 mol % of the composition, the dielectric and piezoelectric characteristics decrease consecutively, but sufficient high dielectric and piezoelectric characteristic values to be applied to dielectric and piezoelectric application components are shown.

The morphotropic phase boundary (MPB) between PbTi$O_3$ and PbZr$O_3$ has been known as representing PbTi$O_3$ to PbZr$O_3$=x to y=0.48 to 0.52 (a molar ratio).

In case that composition changes to 5 mol % of the composition into each area of the rhombohedral phase and the tetragonal phase from the composition in the MPB, the maximum values of x and y are 0.53, and 0.57, respectively, (in other words, when x is the largest, x to y represents 0.53 to 0.47, and when y is the largest, x to y represents 0.43 to 0.57). Furthermore, in case that composition changes to 10 mol % of the composition into each area of the rhombohedral phase and the tetragonal phase from the composition in the MPB, the maximum values of x and y are 0.58, and 0.62, respectively, (in other words, when x is the largest, x to y represents 0.58 to 0.42, and when y is the largest, x to y represents 0.38 to 0.62). The high dielectric and piezoelectric characteristic values are maintained in the range of within 5 mol % of the composition into each area of the rhombohedral phase and the tetragonal phase from the composition in the MPB, and the sufficient high dielectric and piezoelectric characteristic values to be applied to dielectric and piezoelectric application components are shown in the range of within 10 mol % of the composition into each area of the rhombohedral phase and the tetragonal phase from the composition in the MPB.

Also, in case that each content of PbTi$O_3$ and PbZr$O_3$, namely, the values of x and y are 0.05 or below, it is not appropriate to the present invention because no morphotropic phase boundary between the rhombohedral phase and the tetragonal phase may be made, or phase transition temperatures and a coercive electric field are too low.

In said Chemical Formula 1, it is preferable that x belongs into a range of $0.05\leq x\leq 0.58$, and more preferably, satisfying $0.10\leq x\leq 0.58$. That is because phase transition temperatures $T_C$ and $T_{RT}$ are low, piezoelectric charge constants $d_{33}$ and $k_{33}$ are low, or a coercive electric field EC is low when x is less than 0.05, and a dielectric constant $K_3^T$ is low, piezoelectric charge constants $d_{33}$ and $k_{33}$ are low, or a phase transition temperature $T_{RT}$ is low when x exceeds 0.58.

Meanwhile, in Chemical Formula 1, it is preferable that y satisfies the requisite of $0.050 \leq y \leq 0.62$, and more preferably, the requisite of $0.10 \leq y \leq 0.62$. The reason is that phase transition temperatures $T_C$ and $T_{RT}$ are low, piezoelectric charge constants $d_{33}$ and $k_{33}$ are low, or a coercive electric field $E_C$ is low when y is less than 0.05, and a dielectric constant $K_3^T$ is low, or piezoelectric charge constants $d_{33}$ and $k_{33}$ are low when y exceeds 0.62.

With respect to the piezoelectric single crystal represented by the compositional formula of Chemical Formula 1 according to the present invention, a metal tetrad is included in the ions located at [B] from the perovskite type crystal structure ([A][B]O$_3$), and in particular, a form in composition of L is limited to a single form composed of one selected from Zr or Hf, or a mixed form thereof.

When L represents the mixed form, a piezoelectric single crystal represented by a compositional formula of Chemical Formula 2 below is provided:

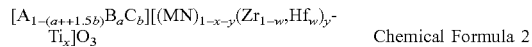

Chemical Formula 2 in said formula, A, B, C, M, and N are identical with those defined in Chemical Formula 1, and a, b, x, and y are also identical with those defined in Chemical Formula 1, but w represents $0.01 \leq w \leq 0.20$.

At this time, when w is less than 0.01, it is problematic in that no dielectric and piezoelectric characteristics are maximized, and when w exceeds 0.20, it is not preferable in that dielectric and piezoelectric characteristics decrease suddenly.

The piezoelectric single crystals represented by the compositional formulae of said Chemical Formula 1 to said Chemical Formula 3 are piezoelectric single crystals in which complex composition of the ions located at [A], and composition of the ions located at [B] from the perovskite type crystal structure ([A][B]O$_3$) are mixed so that a curie temperature $T_C$ is 180° C.; or more, and at the same time as this, a phase transition temperature $T_{RT}$ between a rhombohedral phase and a tetragonal phase is 100° C.; or more. At this time, when the curie temperature is less than 180° C., this is problematic in that it is difficult to raise a coercive electric field $E_C$ up to 5 kV/cm or more, or the phase transition temperature $T_{RT}$ up to 100° C.; or more.

Also, the piezoelectric single crystal represented by the compositional formula of Chemical Formula 1 according to the present invention shows that a longitudinal electromechanical coupling coefficient $k_{33}$ is 0.85 or more, and when the longitudinal electromechanical coupling coefficient is less than 0.85, this is not preferable in that the characteristic shown in the piezoelectric single crystal is similar to that shown in piezoelectric polycrystal ceramic, and energy conversion efficiency gets low.

With respect to the piezoelectric single crystal according to the present invention, it is preferable that the coercive electric field $E_C$ is 3.5 to 12 kV/cm, and when the coercive electric field is less than 3.5 kV/cm, it is problematic in that poling is easily removed at the time of processing of the piezoelectric single crystal, or at the time of manufacturing or using of components to which the piezoelectric single crystal is applied.

Also, the piezoelectric single crystal according to the present invention satisfies a high dielectric constant ($K_3^T \geq 4,000$ to 15,000) and a high piezoelectric charge constant ($d_{33} \geq 1,400$ to 6,000 pC/N) simultaneously.

Also, the piezoelectric single crystal represented by the compositional formula of Chemical Formula 1 according to the present invention may be provided in a single crystal having uniformity because a composition gradient inside of the single crystal is formed in a range of 0.2 to 0.5 mol %.

Since lead zirconate (PbZrO$_3$) has 230° C.; of a high phase transition temperature, and is also effective to cause the morphotropic phase boundary (MPB) to be more perpendicular to a temperature axis, it enables a high phase transition temperature $T_{RT}$ between the rhombohedral phase and the tetragonal phase to be obtained while maintaining a high curie temperature, so composition which causes phase transition temperatures $T_C$ and $T_{RT}$ to be high simultaneously can be developed.

That is because the phase transition temperatures increase in proportion to a content of the lead zirconate even in case that the lead zirconate is mixed into conventional piezoelectric single crystal composition. Accordingly, the piezoelectric single crystal with the perovskite type crystal structure comprising zirconium (Zr) or lead zirconate may overcome problems occurring from existing piezoelectric single crystals. Also, zirconia (ZrO$_2$) or lead zirconate is used in main ingredients from existing materials for piezoelectric polycrystals, and is able to make the objects of the present invention accomplished without an increase in raw material costs because it is a low-priced raw material.

On the contrary, unlike PMN-PT, PZN-PT, and so on, the perovskite type piezoelectric single crystal comprising lead zirconate doesn't show a congruent melting behavior at the time of melting, but shows an incongruent melting behavior. Accordingly, when piezoelectric single crystal shows the incongruent melting behavior, it is divided into liquid phase zirconia and solid phase zirconia (ZrO$_2$) at the time of melting of a solid phase, and it may not be manufactured by a flux method, Bridgman method, and so on which are general single crystal growth methods using a melting process because solid phase zirconia particles inside of a liquid phase interrupts growth of the single crystal.

Also, it is difficult to manufacture a single crystal comprising a reinforced second phase through the general single crystal growth methods using a melting process, and it has never been reported yet to manufacture the single crystal. That is because a reinforced second phase reacts to a liquid phase due to its chemical instability at a melting temperature or more, and the reinforced second phase is thus removed without being maintained in an individual second phase form. Also, since a separation between the second phase and the liquid phase occurs due to a difference in density between the second phase within the liquid phase, and the liquid phase, it is difficult to manufacture a single crystal comprising the second phase, and it also is impossible to adjust volume fraction, a size, a shape, arrangement, distribution, and so on of the reinforced second phase inside of the single crystal.

Thus, according to the present invention, piezoelectric single crystals comprising a reinforced second phase are manufactured using a solid phase single crystal growth method in which no melting process is used. In the solid phase single crystal growth method, single crystal growth occurs at a melting temperature or below, so a chemical reaction between the reinforced second phase and the single crystal is controlled, and the reinforced second phase becomes to exist stably in an individual form inside of the single crystal.

Also, single crystal growth occurs from a polycrystal comprising the reinforced second phase, and there is no change in the volume fraction, size, shape, arrangement, distribution, and so on of the reinforced second phase during the single crystal growth. Accordingly, when the volume fraction, size, shape, arrangement, distribution, and so on of the reinforced second phase inside of the polycrystal are controlled in a process of making the polycrystal comprising the reinforced second phase, and single crystals are grown, as a result thereof, the single crystals comprising the reinforced second phase in a desired form, namely, reinforced piezoelectric single crystals (second phase-reinforced single crystals) may be manufactured.

Accordingly, when the flux method and the Bridgman method which are conventional single crystal growth methods are used, piezoelectric single crystals may not be manufactured in complex composition with respect to the perovskite type crystal structure ([A][B]$O_3$). In particular, in case of the flux method and the Bridgman method including the melting process, single crystals may be manufactured in such a manner that a composition gradient inside of the single crystals is 1 to 5 mol % or more, whereas in case of the solid phase single crystal growth method according to the present invention, single crystals may be manufactured in uniform composition in which a composition gradient inside of the single crystals is 0.2 to 0.5 mol %.

Accordingly, thanks to the solid phase single crystal growth method according to the present invention, with respect to the perovskite type crystal structure ([A][B]$O_3$) comprising lead zirconate, even when mixing of the complex composition of the ions located at [A], and composition of the ions located at [B] forms complicated composition, piezoelectric single crystals grow uniformly, so novel piezoelectric single crystals showing a dielectric constant ($K_3^T \geq 4,000$ or more, preferably, 4,000 to 15,000), a piezoelectric charge constant ($d_{33} \geq 1,400$ pC/N or more, preferably, 1,400 to 6,000 pC/N), and a high coercive electric field ($E_C \geq 4$ to 12 kV/cm) which are remarkably enhanced beyond those shown in conventional piezoelectric single crystals may be provided.

Also, the manufacturing method of the piezoelectric single crystals on the basis of the solid phase single crystal growth method according to the present invention enables mass production at a low process price compared with the flux method and the Bridgman method.

Specifically, a method of manufacturing the piezoelectric single crystal according to the solid phase single crystal growth method of the present invention comprises:

Step (a) of reducing number density of abnormal grains (i.e., the number of abnormal grains/unit area) by adjusting an average size of matrix grains of a polycrystal based on said composition; and Step (b) of growing the abnormal grains by heat-treating the polycrystal which shows that the number density of the abnormal grains obtained through said Step (a) decreases.

According to another manufacturing method, a manufacturing method of the piezoelectric single crystal is provided in such a manner as to thermally treat a polycrystal under a condition that an average size of matrix grains of the polycrystal based on said composition is adjusted so that the number density of abnormal grains decreases.

Based on the above fact, a single crystal may be obtained in such a manner as to continuously grow only a small number of abnormal grains generated in a state of the number density of the abnormal grains of the polycrystal being reduced.

The manufacturing method of the piezoelectric single crystal comprising continuously growing a seed single crystal inside of the polycrystal during heat treatment by uniting the seed single crystal with the polycrystal before the heat treatment of the polycrystal may be provided.

With respect to the manufacturing method, the piezoelectric single crystal is manufactured in such a manner as to obtain a power molding substance by calcining powder based on the composition constituting the piezoelectric single crystal at less than 800 to 900° C. of a temperature, and to carry out a first heat treatment process of sintering the powder molding substance, and a second heat treatment process required at the time of growth of the single crystal.

At this time, it is preferable that the first and second heat treatment processes are carried out at 900 to 1,300° C. for 1 to 100 hours at 1 to 20° C./min of a temperature-raising rate. More preferably, after the first treatment is carried out at 1,000 to 1,200° C., the second heat treatment is carried out, thereby bringing about growth of the single crystal.

The average size R of the matrix grains of the polycrystal is adjusted into within a size range which reaches 0.5 to 2 times ($0.5\ R_c \leq R \leq 2\ R_c$) with respect to a critical size (an average size $R_c$ of the matrix grains which shows that the number density of abnormal grains becomes "0 (zero)"). At this time, in case that the average size of the matrix grains of the polycrystal is smaller than $0.5\ R_c$ ($0.5\ R_c > R$), since the number density of the abnormal grains is too high, no single crystal grows, and in case that the average size of the matrix grains of the polycrystal is greater than $2\ R_c$ ($2\ R_c < R$), the number density of the abnormal grains is "0", but no large single crystal may be manufactured because a growth speed of the single crystal is too slow.

The present invention provides a piezoelectric body in which the piezoelectric single crystal is included alone, or the piezoelectric single crystal and a polymer are mixed.

Although the polymer is not specially limited, as representative one example, when epoxy resin is used in a state of being mixed, the polymer may be provided in a form that causes large resistance to a mechanical impact, and facilitates mechanical processing.

Furthermore, the present invention provides a piezoelectric application component and a dielectric application component using the piezoelectric body composed of the perovskite type piezoelectric single crystal represented by the compositional formula of Chemical Formula 1, or the piezoelectric body in which the piezoelectric single crystal and a polymer are mixed. Specifically, examples of the piezoelectric components include ultrasonic transducers (ultrasonographs for medical treatment, transducers for SONAR (sound navigation ranging), transducers for non-destructive inspection, ultrasonic washers, ultrasonic motors, etc.), piezoelectric actuators ($d_{33}$ type actuators, $d_{31}$ type actuators, d15 type actuators, piezoelectric actuators intended for controlling minute positions, piezoelectric pumps, piezoelectric valves, and piezoelectric speakers, etc.), piezoelectric sensors (piezoelectric G-meters, etc.), electric field-generating transducers, and electric field and vibration-generating transducers.

Also, examples of the dielectric application components include capacitors having a high degree of efficiency, infrared sensors, dielectric filters, and so on.

MODE FOR CARRYING OUT THE INVENTION

Hereinafter, the present invention is described in more detail on the basis of examples.

The present examples are intended for describing the present invention more specifically, and the scope of the present invention should not be construed as being limited to these examples.

<Examples 1 to 5> Production of Piezoelectric
Single Crystals Satisfying Complex Composition of
Ions Located at [A]

A piezoelectric single crystal having a perovskite type structure ($[A][B]O_3$) was produced by a solid phase single crystal growth method, wherein piezoelectric single crystals constituted in complex composition of ions located at [A] as shown in Examples 1 to 5 presented in Table 1 were produced. Also, an excess of quantity of MgO and PbO were added in a synthetic process of powder so that a second phase of MgO, and a pore reinforcement phase were included in 2 vol % inside of the produced single crystals. First, a phase of $MgNb_2O_6$ was produced in such a manner as to mix powder of MgO and powder of $Nb_2O_5$ by ball-milling, and then to calcine them (applying a columbite method), and additionally, perovskite phase powder was produced in such a manner as to mix and calcine some raw material powder again at a quantitative ratio. Mixed powder was produced by addition of the excess of quantity of PbO and MgO into the produced powder. The mixed powder was molded, and was then pressurized and molded at 200 MPa of hydrostatic pressure, and a powder molding substance was subjected to heat treatment at various temperatures ranging from 900° C. to 1300° C. at 25° C. intervals up to for 100 hours. Under the condition that an average size R of matrix grains of a polycrystal may be adjusted into the range of a size ($0.5\ R_c \le R \le 2\ R_c$) which is 0.5 times larger and 2 times smaller than a critical size bringing about the generation of abnormal grains, the quantity of PbO added in the excess of quantity was decided in a range of 10 to 20 mol %, and a temperature for heat treatment was decided in a range of 1000 to 1200° C. (the first sintering). Heat treatment (heat treatment for single crystal growth) was carried out in state of putting a seed single crystal of $Ba(Ti_{0.7}Zr_{0.3})O_3$ on such a produced polycrystal, and the single crystal of polycrystalline composition was produced using continuous growth of the seed single crystal inside of the polycrystal.

When the average size R of the matrix grains of the polycrystal was adjusted into the size range ($0.5\ R_c \le R \le 2\ R_c$) 0.5 times larger and 2 times smaller than the critical size (an average size $R_c$ of the matrix grains which shows that number density of the abnormal grains becomes "0 (zero)") bringing about the generation of the abnormal grains, the seed single crystal grew consecutively inside of the polycrystal. In the present example, when the quantity of PbO in the excess of quantity, and the temperature for the heat treatment were adjusted, the average size R of the matrix grains of the polycrystal could be adjusted into the range of a size which was 0.5 times larger and 2 times smaller than the critical size bringing about the generation of the abnormal grains. When the average size R of the matrix grains of the polycrystal was adjusted into the size range ($0.5\ R_c \le R \le 2\ R_c$), during heat treatment, the seed single crystal of $Ba(Ti_{0.7}Zr_{0.3})O_3$ grew consecutively inside the polycrystal, so the single crystal of composition like the polycrystalline composition was produced, and a size of the grown single crystal was 20×20 $mm^2$ or more. Furthermore, piezoelectric single crystals were produced in such a manner as to change oxygen partial-pressure within an atmosphere during the first sintering of the ceramic power molding substance and the heat treatment for the single crystal growth.

<Examples 6 to 8> Production of Piezoelectric
Single Crystals Satisfying Complex Composition of
Ions Located at [B]

Piezoelectric single crystals of Examples 6 to 8 presented in Table 1, which satisfy complex composition of ions located at [B], were produced by the solid phase single crystal growth method identical with that described in Example 1. An excess of quantity of MgO and PbO were added during a synthetic process of powder so that a second phase of MgO, and a pore reinforcement phase were included in the range of 2 vol % inside of the single crystals produced.

Dielectric and piezoelectric characteristics concerning the piezoelectric single crystals of Examples 1 to 8 produced by the solid phase single crystal growth method were analyzed using an impedance analyzer, a $d_{33}$ type meter, and so on.

TABLE 1

| Subject Area | Compositional Formula of Piezoelectric Single Crystal |
|---|---|
| Example 1 | (Pb, Sr, La) $(Mg_{1/2}Nb_{2/3})$ (Zr, Ti)$O_3$ |
| Example 2 | (Pb, Ca, Si, Sm) $(Mg_{1/2}Nb_{2/3})$ (Zr, Ti)$O_3$ |
| Example 3 | (Pb, Ni, Sm) $(Mg_{1/2}Nb_{2/3})$ (Zr, Ti)$O_3$ |
| Example 4 | (Pb, Sr, Bi) $(Mg_{1/2}Nb_{2/3})$ (Zr, Ti)$O_3$ |
| Example 5 | (Pb, Sr, Sm) $(Mg_{1/2}Nb_{2/3})$ (Zr, Ti)$O_3$ |
| Example 6 | (Pb, Ca, Sr, Bi, Sm) $(Mg_{1/2}Nb_{2/3})$ (Zr, Ti)$O_3$ |
| Example 7 | (Pb, Sr, Sm) $(Mg_{1/2}Nb_{2/3})$ $(Zr_{0.95}, Hf_{0.05})TiO_3$ |
| Example 8 | (Pb, Ca, Sr, Bi, Sm) $(Mg_{1/2}Nb_{2/3})$ $(Zr_{0.95}, Hf_{0.05})TiO_3$ |
| Example 9 | (Pb, Ni, Sm) $(Mg_{1/2}Nb_{2/3})$ $(Zr_{0.90}, Hf_{0.1})TiO_3$ |

<Experimental Example 1> Evaluation 1 on
Dielectric and Piezoelectric Characteristics of the
Piezoelectric Single Crystal of (Pb, Sr,
La)$(Mg_{1/3}Nb_{2/3})$(Zr, Ti)$O_3$ With respect to the piezoelectric single crystal of (Pb, Sr, La)$(Mg_{1/3}Nb_{2/3})$(Zr, Ti)$O_3$ produced in said Example 1, as presented in Table 2 below, dielectric and piezoelectric characteristics of the piezoelectric single crystals produced according to a/b from the complex composition of the ions located at [A] were evaluated.

More specifically, with respect to the single crystal of $[Pb_{1-(a+1.5b)}Sr_aLa_b][(Mg_{1/3}Nb_{2/3})_{0.4}Zr_{0.25}Ti_{0.35}]O_3$ (a=0.02, and $0.0 \le b \le 0.1$) produced, each change in characteristics of a dielectric constant, phase transition temperatures $T_C$ and $T_{RT}$, a piezoelectric charge constant, and a coercive electric field $E_C$ resulting from each change in b [a content of La($^{+3}$)] and a/b [a ratio of Sr($^{+2}$)/La($^{+3}$)] was measured by the IEEE method using an impedance analyzer, and so on as described in Table 2 below.

TABLE 2

| $[Pb_{1-(a+1.5b)}Sr_aLa_b]$ $[(Mg_{1/3}Nb_{2/3})_{0.4}Zr_{0.25}Ti_{0.35}]O_3$ (a = 0.02, and 0.0 < b ≤ 0.1) | | | | | | |
|---|---|---|---|---|---|---|
| a/b (a = 0.02) | 10 (b = 0.002) | 4 (b = 0.005) | 2 (b = 0.01) | 1 (b = 0.02) | 0.5 (b = 0.04) | 0.25 (b = 0.08) |
| Dielectric Constant | 6,230 | 7,150 | 8,773 | 6,100 | 3,670 | 3,260 |
| $T_C/T_{kt}$ [° C.] | 169/117 | 161/112 | 153/104 | 131/79 | 92/56 | 67/32 |

TABLE 2-continued

| [$Pb_{1-(a+1.5b)}Sr_aLa_b$] [$(Mg_{1/3}Nb_{2/3})_{0.4}Zr_{0.25}Ti_{0.35}$]$O_3$ (a = 0.02, and 0.0 < b ≤ 0.1) | | | | | |
|---|---|---|---|---|---|
| a/b<br>(a = 0.02) | 10<br>(b = 0.002) | 4<br>(b = 0.005) | 2<br>(b = 0.01) | 1<br>(b = 0.02) | 0.5<br>(b = 0.04) | 0.25<br>(b = 0.08) |
| tan δ [%] | 0.4 | 0.6 | 0.5 | 3.2 | 3.5 | 4.8 |
| $d_{33}$ [pC/N] | 1,840 | 2,110 | 2,650 | 1,560 | 840 | 630 |
| $k_{33}$ | 0.95 | 0.95 | 0.93 | 0.89 | 0.84 | 0.81 |
| $E_C$ [kV/cm] | 4.4 | 4.1 | 3.8 | 2.8 | 1.9 | 1.6 |

As confirmed from the result shown in Table 2 above, as the result of evaluating characteristics concerning the piezoelectric charge constant, the dielectric constant and a dielectric loss of (001) the piezoelectric single crystal (a=0.02; b=0.01; a/b=2), the piezoelectric charge constant $d_{33}$ was 2,650 pC/N, the dielectric charge was 8,773, and the dielectric loss tan 5 was 0.50.

As the result, physical properties of the piezoelectric single crystal were observed to change largely according to the changes in b [the content of La($^{+3}$)] and a/b [the ratio of Sr($^{+2}$)/La($^{+3}$)]. In particular, single crystal growth occurred limitedly from composition satisfying "a/b<2", and the grown single crystal even included many defects. Also, with respect to the composition satisfying "a/b<2", the dielectric loss increased largely, and the dielectric constant and the piezoelectric charge constant decreased largely.

Accordingly, in the composition area in which "a/b≥2" was satisfied, a growth speed of the single crystal, and a state of the grown single crystal were relatively excellent. These results showed that single crystals based on the composition satisfying "a/b≥2" had higher potential for practical application due to better piezoelectric properties and single crystal growth characteristic.

Also, with respect to the single crystal of [$Pb_{1-(a+1.5b)}Sr_aLa_b$][$(Mg_{1/3}Nb_{2/3})_{0.4}Zr_{0.25}Ti_{0.35}$]$O_3$ (0.0<a≤0.15, and b=0.01) produced, each change in characteristics of a dielectric constant, phase transition temperatures $T_C$ and $T_{RT}$, a piezoelectric charge constant, and a coercive electric field $E_C$, resulting from each change in a [a content of Sr($^{+2}$)], and a/b [a ratio of Sr($^{+2}$)/La($^{+3}$)] was measured by the IEEE method using an impedance analyzer, and so on as described in Table 3 below.

satisfying "a/b<2", the dielectric constant and the piezoelectric charge constant decreased largely, and the dielectric loss increased largely.

Accordingly, in the composition area in which "a/b≥2" was satisfied, a growth speed of the single crystal, and a state of the grown single crystal were relatively excellent. These results showed that single crystals based on the composition satisfying "a/b≥2" had higher potential for practical application due to better piezoelectric properties and single crystal growth characteristic.

With respect to the single crystal of [$Pb_{1-(a+1.5b)}Sr_aLa_b$] [$(Mg_{1/3}Nb_{2/3})_{0.4}Zr_{0.25}Ti_{0.35}$]$O_3$ produced in said Example 1, when growth and piezoelectric physical properties of the piezoelectric single crystal resulting from each change in a [the content of Sr($^{+2}$)], b [a content of La($^{+3}$)], and a/b [the ratio of Sr($^{+2}$)/La($^{+3}$)] were evaluated, in the composition areas in which "0.01≤a≤0.10" and "0.0 1≤b≤0.05" were satisfied, the growth and the physical properties of the single crystal were excellent. More preferably, in case of the composition satisfying a/b≥2, the best excellent piezoelectric single crystal could be developed.

<Experimental Example 2> Evaluation 2 on Dielectric and Piezoelectric Characteristics of the Piezoelectric Single Crystal of (Pb, Ca, Sr, Sm)($Mg_{1/3}Nb_{2/3}$)(Zr, Ti)$O_3$ With respect to the piezoelectric single crystal of composition of [$Pb_{1-(a+1.5b+c)}Ca_cSr_aSm_b$][$(Mg_{1/3}Nb_{2/3})_{0.35}Zr_{0.30}Ti_{0.35}$]$O_3$ (0.0≤a≤0.15, 0.0≤b≤0.1, and 0.0≤c≤0.1) produced in said Example 2, each change in characteristics of a dielectric constant, phase transition temperatures $T_C$ and

TABLE 3

| [ $Pb_{1-(a+1.5b)}Sr_aLa_b$ ] [ $(Mg_{1/3}Nb_{2/3})_{0.4}Zr_{0.25}Ti_{0.35}$]$O_3$ (0.0 < a ≤ 0.15), and b = 0.01) | | | | | |
|---|---|---|---|---|---|
| a/b<br>(b = 0.01) | 10<br>(a = 0.1) | 4<br>(a = 0.04) | 2<br>(a = 0.02) | 1<br>(a = 0.01) | 0.5<br>(a = 0.05) |
| Dielectric Constant | 15,980 | 11,350 | 8,750 | 5,140 | 4,410 |
| $T_c/T_{kt}$ [° C.] | 73/43 | 128/86 | 153/104 | 168/119 | 173/127 |
| tan δ [%] | 1.4 | 1.2 | 0.5 | 2.8 | 3.2 |
| $d_{33}$ [pC/N] | 4,770 | 3,720 | 2,650 | 1,430 | 1,240 |
| $k_{33}$ | 0.95 | 0.95 | 0.93 | 0.89 | 0.84 |
| $E_c$ [kV/cm] | 3.1 | 3.5 | 3.8 | 3.8 | 3.9 |

As shown in Table 3 above, physical properties of the piezoelectric single crystal were observed to change largely according to the changes in a [the content of Sr($^{+2}$)], and a/b [the ratio of Sr($^{+2}$)/La($^{+3}$)]. In particular, single crystal growth occurred limitedly from composition satisfying the requisite of "a/b<2", and the grown single crystal even included many defects. Also, with respect to the composition $T_{RT}$, a piezoelectric charge constant, and a coercive electric field $E_C$ according to each change in a [a content of Sr($^{+2}$)], c [a content of Ca($^{2+}$)], and (a+c)/b [(a ratio of Sr($^{+2}$)+Ca($^{2+}$))/Sm($^{+3}$)] from complex composition of the ions located at [A] was measured by the IEEE method using an impedance analyzer, and so on as described in Table 4 below.

TABLE 4

[Pb$_{1-(a+1.5b+c)}$Ca$_c$Sr$_a$Sm$_b$] [(Mg$_{1/3}$Nb$_{2/3}$)$_{0.35}$Zr$_{0.30}$Ti$_{0.35}$]O$_3$ (0.0 ≤ a ≤ 0.15), 0.0 < b ≤ 0.1, and 0.0 ≤ c ≤ 0.1)

| a/b | 0.04/0.01 | 0.02/0.01 | 0.02/0.00 | 0.01/0.005 | 0.005/0.005 |
|---|---|---|---|---|---|
| ((a + c)/b) | (5) | (3) | (2) | (1.5) | (1) |
| Dielectric Constant | 15,980 | 13,750 | 14,678 | 8,650 | 5,330 |
| T$_c$/T$_{kt}$ [° C.] | 119/71 | 146/82 | 141/85 | 153/103 | 161/110 |
| tan δ [%] | 1.2 | 0.9 | 1.0 | 2.2 | 2.9 |
| d$_{33}$ [pC/N] | 4,940 | 3,880 | 4,457 | 1,730 | 1,340 |
| k$_{33}$ | 0.93 | 0.92 | 0.94 | 0.89 | 0.84 |
| E$_c$ [kV/cm] | 3.0 | 3.6 | 3.2 | 3.8 | 3.9 |

As confirmed from the result shown in Table 4 above, as the result of evaluating characteristics concerning a piezoelectric charge constant, a dielectric constant, and a dielectric loss of (001) the piezoelectric single crystal (a=0.02, b=0.01, and c=0.00), the piezoelectric charge constant d$_{33}$ was 4,457 pC/N, the dielectric charge was 14,678, and the dielectric loss tan 5 was 1.00.

As shown in said Table 4, physical properties of the piezoelectric single crystal were observed to change largely according to each changes in a [the content of Sr(+2)], c [the content of Ca(2+)], and (a+c)/b [(the ratio of Sr(+2)+Ca(2+))/Sm(+3)]. In particular, single crystal growth occurred limitedly from composition satisfying "(a+c)/b<2", and the grown single crystal even included many defects. Also, with respect to the composition satisfying "(a+c)/b<2", the dielectric loss increased largely, and the dielectric constant and the piezoelectric charge constant decreased largely.

Accordingly, in the composition area in which "(a+c)/b<2" was satisfied, a growth speed of the single crystal, and a state of the grown single crystal were relatively excellent. These results showed that single crystals based on the composition satisfying "(a+c)/b<2" had higher potential for practical application due to better piezoelectric properties and single crystal growth characteristic.

Also, with respect to the single crystal of [Pb$_{1-(a+1.5b+c)}$Ca$_c$Sr$_a$Sm$_b$][(Mg$_{1/3}$Nb$_{2/3}$)$_{0.35}$Zr$_{0.30}$Ti$_{0.35}$]O$_3$ (0.0≤a≤0.15, 0.0≤b≤0.1, and c=0.01) produced in said Example 2, each change in characteristics of a dielectric constant, phase transition temperatures T$_C$ and T$_{RT}$, a piezoelectric charge constant, and a coercive electric field E$_c$ resulting from each change in a [a content of Sr(+2)], b [a content of Sm(3+)], and (a+c)/b [(a ratio of Sr(+2)+Ca(2+))/Sm(+3)] was measured by the IEEE method using an impedance analyzer, and so on as described in Table 5 below.

As shown in Table 5 above, physical properties of the piezoelectric single crystal were observed to change largely according to each change in a [the content of Sr(+2)], b [the content of Sm(3+)], and (a+c)/b [(the ratio of Sr(+2)+Ca(2+))/Sm(+3)]. In particular, single crystal growth occurred limitedly from composition satisfying "(a+c)/b<2", and the grown single crystal even included many defects. Also, with respect to the composition satisfying "(a+c)/b<2", the dielectric loss increased largely, and the dielectric constant and the piezoelectric charge constant decreased largely.

Accordingly, in the composition area in which "(a+c)/b 2" is satisfied, a growth speed of the single crystal, and a state of the grown single crystal were relatively excellent. These results showed that single crystals based on the composition "(a+c)/b≥2" had higher potential for practical application due to better piezoelectric properties and single crystal growth characteristic.

Also, with respect to the single crystal of [Pb$_{1-(a+1.5b+c)}$Ca$_c$Sr$_a$Sm$_b$][(Mg$_{1/3}$Nb$_{2/3}$)$_{0.35}$Zr$_{0.30}$Ti$_{0.35}$]O$_3$ (0.0≤a≤0.15, 0.0≤b≤0.1, and 0.0≤c≤0.1) produced in said Example 2, as a result of evaluating growth and piezoelectric physical properties of the piezoelectric single crystal resulting from each change in a [the content of Sr(+2)], b [the content of Sm(+3)], c [a content of Ca [+2]], and (a+c)/b, in the composition area in which "0.01≤(a+c)≤0.10" and "0.01≤b≤0.05" were satisfied, the growth and the physical properties of the single crystal were excellent. More preferably, in case of the composition satisfying (a+c)/b≥2, the best excellent piezoelectric single crystal could be developed.

TABLE 5

[Pb$_{1-(a+1.5b+c)}$Ca$_c$Sr$_a$Sm$_b$] [(Mg$_{1/3}$Nb$_{2/3}$)$_{0.35}$Zr$_{0.30}$Ti$_{0.35}$]O$_3$ (0.0 ≤ a ≤ 0.15), 0.0 < b > 0.1, and c = 0.01)

| a/b | 0.04/0.01 | 0.02/0.01 | 0.01/0.01 | 0.01/0.02 | 0.01/0.04 |
|---|---|---|---|---|---|
| ((a + c)/b) | (5) | (3) | (2) | (1) | (0.5) |
| Dielectric Constant | 15,980 | 13,750 | 8,850 | 6,650 | 3,130 |
| T$_c$/T$_{kt}$ [° C.] | 119/71 | 146/82 | 154/99 | 133/81 | 101/52 |
| tan δ [%] | 1.2 | 0.9 | 1.8 | 2.9 | 3.3 |
| d$_{33}$ [pC/N] | 4,940 | 3,880 | 1,720 | 1,310 | 810 |
| k$_{33}$ | 0.93 | 0.92 | 0.90 | 0.89 | 0.84 |
| E$_c$ [kV/cm] | 3.0 | 3.6 | 3.9 | 3.4 | 2.2 |

<Experimental Example 3> Evaluation 3 on Dielectric and Piezoelectric Characteristics of the Piezoelectric Single Crystal of (Pb, Ni, Sm)(Mg$_{1/3}$Nb$_{2/3}$)(Zr, Ti)O$_3$ With respect to the piezoelectric single crystal of composition of [Pb$_{1-(a+1.5b)}$Ni$_a$Sm$_b$][(Mg$_{1/3}$Nb$_{2/3}$)$_{0.35}$Zr$_{0.30}$Ti$_{0.35}$]O$_3$ (0.0≤a≤0.15, and 0.0<b≤0.1) produced in said Example 3, each change in characteristics of a dielectric constant, a piezoelectric charge constant, a longitudinal electromechanical coupling coefficient k$_{33}$ according to each change in a [a Ni content], and a/b [a ratio of Ni/Sm] from the single crystal based on composition satisfying a=0.02, and 0.0≤b≤0.1 was measured by the IEEE method using an impedance analyzer, and so on as described in Table 6 below.

TABLE 6

[Pb$_{1-(a+1.5b)}$Ni$_a$Sm$_b$][(Mg$_{1/3}$Nb$_{2/3}$)$_{0.35}$Zr$_{0.30}$Ti$_{0.35}$]O$_3$
(a = 0.02, and 0.0 ≤ b ≤ 0.1)

| a/b (a = 0.02) | 4 (b = 0.005) | 2 (b = 0.01) | 1 (b = 0.02) | 0.5 (b = 0.04) |
|---|---|---|---|---|
| Dielectric Constant | 7,720 | 8,990 | 4,390 | 2,540 |
| tan δ [%] | 0.9 | 1.2 | 3.4 | 4.6 |
| d$_{33}$ [pC/N] | 2,320 | 3,190 | 1,310 | 630 |
| k$_{33}$ | 0.93 | 0.91 | 0.82 | 0.76 |

As shown in Table 6 above, physical properties of the piezoelectric single crystal were observed to change largely according to each change in a [the Ni content], and a/b [the ratio of Ni/Sm]. In particular, in the composition satisfying "a/b<2", growth of the single crystal occurred limitedly, and the grown single crystal also includes many defects. Also, with respect to the composition satisfying "a/b<2", a dielectric loss increased largely, and the dielectric constant and the piezoelectric charge constant decreased largely.

Accordingly, in the composition area in which "a/b≥2" was satisfied, a growth speed of the single crystal, and a state of the grown single crystal were relatively excellent. These results showed that single crystals based on the composition satisfying "a/b≥2" had higher potential for practical application due to better piezoelectric properties and single crystal growth characteristic.

Also, with respect to the single crystal of [Pb$_{1-(a+1.5b)}$Ni$_a$Sm$_b$][(Mg$_{1/3}$Nb$_{2/3}$)$_{0.35}$Zr$_{0.30}$Ti$_{0.35}$]O$_3$ (0.0≤a≤0.15, and 0.0≤b≤0.1) produced in said Example 3, as a result of evaluating growth and piezoelectric physical properties of the piezoelectric single crystal resulting from each change in a [a Ni content], b [a Sm content], and a/b, in the composition area in which "0.01≤a≤0.10" and "0.01≤b≤0.05" were satisfied, the growth and the physical properties of the single crystal were excellent. More preferably, in case of the composition satisfying "a/b≥2", the best excellent piezoelectric single crystal could be developed.

<Experimental Example 4> Evaluation 4 on Dielectric and Piezoelectric Characteristics of the Piezoelectric Single Crystal of (Pb, Sr, Sm)(Mg$_{1/3}$Nb$_{2/3}$)(Zr, Hf)TiO$_3$ With respect to the piezoelectric single crystal of [Pb$_{0.98-1.5x}$Sr$_a$Sm$_b$][(Mg$_{1/3}$Nb$_{2/3}$)$_{0.35}$(Zr$_{1-x}$Hf$_x$)$_{0.30}$Ti$_{0.35}$]O$_3$ (0.0≤a≤0.15, 0.0≤b≤0.1, and 0.0≤x≤0.5) produced in said Example 6, each change in characteristics of a dielectric constant, a piezoelectric charge constant, a longitudinal electromechanical coupling coefficient k$_{33}$ according to each change in a [Sr content], b [a Sm content], a/b [a ratio of Sr/Sm], and x [a Hf content] was measured by the IEEE method using an impedance analyzer, and so on as described in Table 7 below.

TABLE 7

[Pb$_{0.98 - 1.5x}$Sr$_a$Sm$_b$][(Mg$_{1/3}$Nb$_{2/3}$)$_{0.35}$(Zr$_{1-x}$Hf$_x$)$_{0.30}$Ti$_{0.35}$]O$_3$ (0.0 ≤ a ≤ 0.15, 0.0 < b > 0.1, and 0.0 { x < 0.5)

| x (a = 0.02, and b = 0.01) | 0 | 0.1 | 0.2 | 0.4 |
|---|---|---|---|---|
| Dielectric Constant | 14,680 | 15,210 | 15,880 | 12,420 |
| tan δ [%] | 1.0 | 1.5 | 2.1 | 2.2 |
| d$_{33}$ [pC/N] | 4,460 | 4,890 | 3,830 | 3,390 |
| k$_{33}$ | 0.93 | 0.94 | 0.93 | 0.90 |

As shown in Table 7 above, physical properties of the piezoelectric single crystal were observed to change largely according to each change in a [the Sr content], b [the Sm content], a/b [the ratio of Sr/Sm], and x [the Hf content]. In particular, in the composition satisfying "0.0≤x≤0.5", growth of the single crystal occurred more rapidly, and defects inside of the grown single crystal also decreased. Also, with respect to the composition satisfying "0.0≤x≤0.2", the dielectric and piezoelectric charge constants increased. These results showed that piezoelectric single crystals based on the composition satisfying "0.0≤x≤0.5" had higher potential for practical application due to better piezoelectric properties and single crystal growth characteristic.

<Experimental Example 5> Evaluation 5 on Dielectric and Piezoelectric Characteristics of the Piezoelectric Single Crystal of (Pb, Ni, Sm)(Mg$_{1/3}$Nb$_{2/3}$)(Zr, Hf)TiO$_3$ With respect to the piezoelectric single crystal of [Pb$_{0.98-1.5x}$Ni$_a$Sm$_b$][(Mg$_{1/3}$Nb$_{2/3}$)$_{0.35}$ (Zr$_{1-x}$Hf$_x$)$_{0.30}$Ti$_{0.35}$]

$O_3$ (0.0≤a≤0.1, 0.0≤b≤0.1, and 0.0≤x≤0.5) produced in said Example 8, each change in characteristics of a dielectric constant, a piezoelectric charge constant, a longitudinal electromechanical coupling coefficient $k_{33}$ according to each change in a [a Ni content], b [a Sm content], a/b [a ratio of Ni/Sm], and x [a Hf content] was measured by the IEEE method using an impedance analyzer, and so on as described in Table 8 below.

TABLE 8

$[Pb_{0.98-1.5x}Ni_aSm_b][(Mg_{1/3}Nb_{2/3})_{0.35}(Zr_{1-x}Hf_x)_{0.30}Ti_{0.35}]O_3$ (0.0 ≤ a ≤ 0.1, 0.05 b ≤0.1, and 0.0 ≤ x ≤ 0.5)

| x (a = 0.02, and b = 0.01) | 0 | 0.1 | 0.2 | 0.4 |
|---|---|---|---|---|
| Dielectric Constant | 8,990 | 9,460 | 9,120 | 8,220 |
| tan δ [%] | 1.2 | 1.8 | 2.3 | 2.2 |
| $d_{33}$ [pC/N] | 3,190 | 3,340 | 3,270 | 2,740 |
| $k_{33}$ | 0.91 | 0.92 | 0.92 | 0.89 |

As shown in Table 8 above, physical properties of the piezoelectric single crystal were observed to change largely according to each change in a [the Ni content], b [the Sm content], a/b [the ratio of Ni/Sm], and x [the Hf content]. In particular, in the composition satisfying "0.0≤x≤0.5", growth of the single crystal occurred more rapidly, and defects inside of the grown single crystal also decreased. Also, with respect to the composition satisfying "0.0≤x≤0.2", the dielectric and piezoelectric charge constants increased. These results showed that piezoelectric single crystals based on the composition satisfying "0.0≤x≤0.5" had higher potential for practical application due to better piezoelectric properties and single crystal growth characteristic.

<Experimental Example 6> Measurement of Fracture Strength

With respect to the piezoelectric single crystal of the composition of $[Pb_{1-(a+1.5b)}Sr_aLa_b][(Mg_{1/3}Nb_{2/3})_{0.4}Zr_{0.25}Ti_{0.35}]O_3$ (0.0≤a≤0.15, and b=0.01) produced in said Example 1, mechanical characteristics of fracture strength, fracture toughness, and so on according to each pore content inside of the single crystal were compared and measured. At this time, values of the fracture strength were measured by a method of measuring four-point bending strength, and the results thereof were described in Table 10 (a=0.02, and b=0.01) and Table 11 (a=0.04, and b=0.01).

TABLE 9

| Volume Fraction of Pore [%] | Fracture Strength [MPa] | Fracture Toughness [MPa · $m^{1/2}$] |
|---|---|---|
| 0.5 | 43 | 0.36 |
| 5 | 76 | 0.85 |
| 10 | 83 | 1.05 |
| 20 | 77 | 1.12 |
| 30 | 58 | 1.01 |

TABLE 10

| Volume Fraction of Pore [%] | Fracture Strength [MPa] | Fracture Toughness [MPa · $m^{1/2}$] |
|---|---|---|
| 0.5 | 42 | 0.38 |
| 5 | 71 | 0.76 |
| 10 | 69 | 0.93 |

TABLE 10-continued

| Volume Fraction of Pore [%] | Fracture Strength [MPa] | Fracture Toughness [MPa · $m^{1/2}$] |
|---|---|---|
| 20 | 76 | 0.82 |
| 30 | 61 | 0.72 |

As confirmed from the results, the piezoelectric single crystal of $[Pb_{1-(a+1.5b)}Sr_aLa_b][(Mg_{1/3}Nb_{2/3})_{0.4}Zr_{0.25}Ti_{0.35}]O_3$ (0.0≤a≤0.15, and b=0.01) produced by the solid phase single crystal growth method showed an increasing tendency in the fracture strength and the fracture toughness in case that a pore was included inside of the single crystal, and when the pore content is within 20%, the values of high fracture strength, and high fracture toughness were shown. In particular, the more a shape of the pore was similar to a globular shape, the more an effect of improvement of the mechanical characteristics increased. Accordingly, in case that the pore, and reinforced phases, like MgO, and so on, were included inside of the single crystal, the single crystal showed an increase in resistance to a mechanical impact from the outside, and as a result, mechanical performance of the single crystal of a composite was improved largely.

Based on the results as described above, the piezoelectric single crystal was produced, wherein the piezoelectric single crystal was excellent in terms of all the two kinds of characteristics, which show that the high piezoelectric characteristic was maintained and the mechanical brittleness characteristic was improved, as the piezoelectric characteristic was maximized owing to the composition of the piezoelectric single crystal, and the mechanical characteristic of the single crystal was also enhanced using the reinforced phases.

As previously described, although the present invention has been described in detail on the basis of only the detailed examples as described, it should be obvious that various variations and modifications can be made by those having ordinary skill in the art within the scope of the technical ideas of the present invention, and it should be natural that these variations and modifications belong into the scope of the accompanying claims.

What is claimed is:

1. A piezoelectric single crystal having a perovskite type structure expressed by a composition formula of Chemical Formula 1 below:

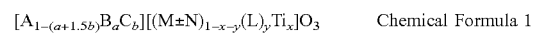

$[A_{1-(a+1.5b)}B_aC_b][(M\pm N)_{1-x-y}(L)_yTi_x]O_3$   Chemical Formula 1 in said formula, A represents Pb or Ba,
B represents at least one or more elements selected from the group consisting of Ba, Ca, Co, Fe, Ni, Sn, and Sr,
C represents one or more elements selected from the group consisting of Co, Fe, La, Ce, Pr, Nd, Pm, Sm, Eu, Gd, Tb, Dy, Ho, Er, Tm, Yb, and Lu, L represents a single form composed of one selected from Zr or Hf, or a mixed form thereof, M represents at least one or more element selected from the group consisting of Ce, Co, Fe, In, Mg, Mn, Ni, Sc, Yb, and Zn, N represents at least one or more elements selected from the group consisting of Nb, Sb, Ta, and W, and a, b, x, and y represent $0<a\le0.10$, $0<b\le0.05$, $0.05\le x\le0.58$, and $0.05\le y\le0.62$, respectively, wherein $a/b\ge2$.

2. The piezoelectric single crystal of claim 1, wherein when L represents a mixed form, the piezoelectric single crystal is expressed by a compositional formula of Chemical Formula 2 below:

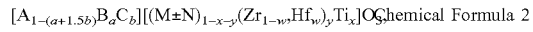Chemical Formula 2 where w represents $0.01\le w\le0.20$.

3. The piezoelectric single crystal of claim 1, wherein in said formula, a and b represent $0.01\le a\le0.10$, and $0.01\le b\le0.05$, respectively.

4. The piezoelectric single crystal of claim 1, wherein in said formula, x and y represents $0.10\le x\le0.58$, and $0.10\le y\le0.62$, respectively.

5. The piezoelectric single crystal of claim 1, wherein the piezoelectric single crystal shows that a composition gradient inside of the single crystal is formed in a range of 0.2 to 0.5 mol %.

6. The piezoelectric single crystal of claim 1, wherein 0.1 to 20% reinforced second phase P is further included in composition of the piezoelectric single crystal at a volume ratio.

7. The piezoelectric single crystal of claim 6, wherein the reinforced second phase P is a metal phase, an oxide phase, or a pore.

8. The piezoelectric single crystal of claim 7, wherein the reinforced second phase P is at least one or more materials selected from the group consisting of Au, Ag, Ir, Pt, Pd, Rh, MgO, $ZrO_2$, and a pore.

9. The piezoelectric single crystal of claim 7, wherein the reinforced second phase P is uniformly distributed in a grain form inside of the piezoelectric single crystal, or is regularly distributed while having a fixed pattern.

10. The piezoelectric single crystal of claim 1, wherein said x and said y belong into a range of within 10 mol % from composition in a morphotropic phase boundary (MPB) between a rhombohedral phase and a tetragonal phase.

11. The piezoelectric single crystal of claim 1, wherein said x and said y belong into a range of within 5 mol % from the composition in the morphotropic phase boundary (MPB) between the rhombohedral phase and the tetragonal phase.

12. The piezoelectric single crystal of claim 1, wherein the piezoelectric single crystal shows that a curie temperature $T_C$ is 180° C. or more, and at the same time as this, a phase transition temperature $T_{RT}$ between the rhombohedral phase and the tetragonal phase is 100° C. or more.

13. The piezoelectric single crystal of claim 1, wherein the piezoelectric single crystal shows that a longitudinal electromechanical coupling coefficient $k_{33}$ is 0.85 or more.

14. The piezoelectric single crystal of claim 1, wherein the piezoelectric single crystal shows that a coercive electric field $E_C$ is 3.5 to 12 kV/cm.

15. The piezoelectric single crystal of claim 1, wherein the piezoelectric single crystal satisfies that a dielectric constant $K_3^T$ is 4,000 to 15,000, and a piezoelectric charge constant $d_{33}$ is 1,400 to 6,000 pC/N.

16. A method of manufacturing a piezoelectric single crystal, comprising:

A Step (a) of reducing number density of abnormal grains by adjusting an average size of matrix grains of a polycrystal based on composition which constitutes the piezoelectric single crystal of claim 1;

Step (b) of growing the abnormal grains by heat-treating the polycrystal which shows that the number density of the abnormal grains obtained through said Step (a) decreases, wherein a power molding substance is obtained in such a manner as to calcine powder based on the composition constituting the piezoelectric single crystal at a temperature of less than 800 to 900° C., and a first heat treatment process of sintering the powder molding substance, and a second heat treatment process required at the time of growth of the single crystal are carried out.

17. The method of claim 16, wherein the first and second heat treatment processes are carried out at 900 to 1,300° C.

18. The method of claim 17, wherein the heat treatments are carried out at 1 to 20° C./min of a temperature-raising rate for 1 to 100 hours.

19. The method of claim 16, wherein the average size R of the matrix grains of the polycrystal is adjusted into the range of a size $(0.5\ R_c\le R\le2\ R_c)$ which is 0.5 times larger and 2 times smaller than a critical size (an average size $R_c$ of the matrix grains which shows that number density of the abnormal grains becomes "0 (zero)") bringing about generation of the abnormal grains.

20. A piezoelectric application component and a dielectric application component using a piezoelectric body composed of the piezoelectric single crystal of claim 1, or a piezoelectric body in which the piezoelectric single crystal of claim 1, and a polymer are mixed.

21. The piezoelectric application component and the dielectric application component of claim 20, wherein the piezoelectric application component and the dielectric application component are any one selected from the group consisting of ultrasonic transducers, piezoelectric actuators, piezoelectric sensors, dielectric capacitors, electric field-generating transducers, and electric field and vibration-generating transducers.

* * * * *